（12）United States Patent
Ishii et al.

(10) Patent No.: US 7,586,046 B2
(45) Date of Patent: Sep. 8, 2009

(54) WIRED CIRCUIT BOARD

(75) Inventors: Jun Ishii, Osaka (JP); Yasuhito Funada, Osaka (JP); Yasunari Ooyabu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/514,963

(22) Filed: Sep. 5, 2006

(65) Prior Publication Data

US 2007/0051534 A1 Mar. 8, 2007

(30) Foreign Application Priority Data

Sep. 5, 2005 (JP) ............................. 2005-257071

(51) Int. Cl.
*H05K 1/03* (2006.01)
(52) U.S. Cl. ....................... 174/255; 174/254
(58) Field of Classification Search ................ 174/254, 174/255, 260, 262
See application file for complete search history.

(56) References Cited

U.S. PATENT DOCUMENTS

| | | | |
|---|---|---|---|
| 4,657,778 A * | 4/1987 | Moran | 427/555 |
| 5,059,242 A * | 10/1991 | Firmstone et al. | 106/1.23 |
| 5,126,016 A * | 6/1992 | Glenning et al. | 205/125 |
| 5,858,518 A | 1/1999 | Omote et al. | |
| 6,096,482 A | 8/2000 | Omote et al. | |
| 6,100,582 A | 8/2000 | Omote et al. | |
| 6,316,734 B1 * | 11/2001 | Yang | 174/256 |
| 6,459,043 B1 * | 10/2002 | Dodsworth | 174/254 |
| 6,900,967 B1 * | 5/2005 | Coon et al. | 360/245.9 |
| 6,995,954 B1 * | 2/2006 | Coon | 360/245.9 |
| 7,142,395 B2 * | 11/2006 | Swanson et al. | 360/245.9 |
| 2004/0221447 A1 | 11/2004 | Ishii et al. | |
| 2006/0118905 A1 * | 6/2006 | Himori et al. | 257/531 |

FOREIGN PATENT DOCUMENTS

| | | |
|---|---|---|
| CN | 1610486 A | 4/2005 |
| EP | 0 153 650 | 9/1985 |
| EP | 1 581 032 | 9/2005 |
| JP | 05-259591 * | 8/1993 |
| JP | H10-12983 | 1/1998 |
| WO | WO 2005/055683 | 6/2005 |

* cited by examiner

*Primary Examiner*—Ishwar (I. B.) Patel
(74) *Attorney, Agent, or Firm*—Jean C. Edwards, Esq.; Akerman Senterfitt

(57) ABSTRACT

The invention provides a wired circuit board that can prevent deterioration of a conductive pattern and short-circuiting of the conductive pattern. The wired circuit board is presented herein in the form of a suspension board with circuit which comprises an insulating base layer formed on a metal supporting board, a conductive pattern formed on the insulating base layer, a metal oxide layer formed on a surface of the conductive pattern and on a surface of the insulating base layer by sputtering, and an insulating cover layer, formed on the metal oxide layer, to cover the conductive pattern. According to this suspension board with circuit, since the metal oxide layer to cover the conductive pattern is formed by the sputtering, the metal oxide layer can be formed with a uniform thickness. Hence, the metal oxide layer can fully function as a barrier layer to the conductive pattern and, accordingly, deterioration of the conductive pattern and the short-circuiting of the conductive pattern can be prevented effectively.

2 Claims, 4 Drawing Sheets

(a)

(b)

(c)

(d)

(e)

(f)

(g)

(h)

(i)

WIRED CIRCUIT BOARD

CROSS REFERENCE TO RELATED APPLICATION

This application claims priority from Japanese Patent Application No. 2005-257071, filed on Sep. 5, 2005, the contents of which are herein incorporated by reference in their entirety.

BACKGROUND OF THE INVENTION

1. Field of the Invention

The present invention relates to a wired circuit board and, more particularly, to a wired circuit board such as a flexible wired circuit board and a suspension board with circuit.

2. Description of the Prior Art

A wired circuit board, such as a flexible wired circuit board and a suspension board with circuit, comprises in general an insulating base layer of e.g. polyimide resin, a conductive layer of copper foil e.g. formed on the insulating base layer, and an insulating cover layer of e.g. polyimide resin formed on the insulating base layer for covering the conductive layer. This wired circuit board is widely used in various fields of electric and electronic devices and equipment.

Meanwhile, there has been proposed an improvement of this wired circuit board, according to which a thin nickel film is formed on a surface of a conductive copper layer by electroless nickel plating to cover the surface of the conductive copper layer (cf. JP Laid-open (Unexamined) Patent Publication No. Hei 10-12983, for example).

The proposed thin nickel film described in JP Laid-open (Unexamined) Patent Publication No. Hei 10-12983 functions as a barrier layer to cover the surface of the conductive copper layer to prevent the copper (metal) of the conductive copper layer from diffusing into the insulating cover layer, so as to prevent deterioration of the conductive copper layer and short-circuiting of the conductive copper layer.

However, since this proposed thin nickel film described in JP Laid-open (Unexamined) Patent Publication No. Hei 10-12983 is formed by electroless nickel plating, it may be difficult to form the thin nickel film in a uniform thickness. If this is the case, a thinned portion of the thin nickel layer cannot substantially function as the barrier layer so that there is still a possibility that deterioration of the conductive copper layer and short-circuiting of the conductive copper layer may occur.

SUMMARY OF THE INVENTION

It is an object of the invention to provide a wired circuit board that can prevent deterioration of a conductive pattern and short-circuiting of the conductive pattern.

To achieve the object described above, the present invention provides a wired circuit board comprising an insulating base layer, a conductive pattern formed on the insulating base layer, a metal oxide layer formed to cover the conductive pattern by sputtering, and an insulating cover layer formed over the insulating base layer to cover the conductive pattern covered by the metal oxide layer.

It is preferable that in the wired circuit board of the present invention, a surface resistance of the metal oxide layer is not less than $10^{12}$ $\Omega/\square$.

According to the wired circuit board of the present invention, since the metal oxide layer is formed by the sputtering, the metal oxide layer can be formed in a uniform thickness. Hence, the metal oxide layer can fully function as a barrier layer to the conductive pattern and, accordingly, deterioration of the conductive pattern and short-circuiting of the conductive pattern can be prevented effectively.

DETAILED DESCRIPTION OF THE PREFERRED EMBODIMENTS

Figure 1:
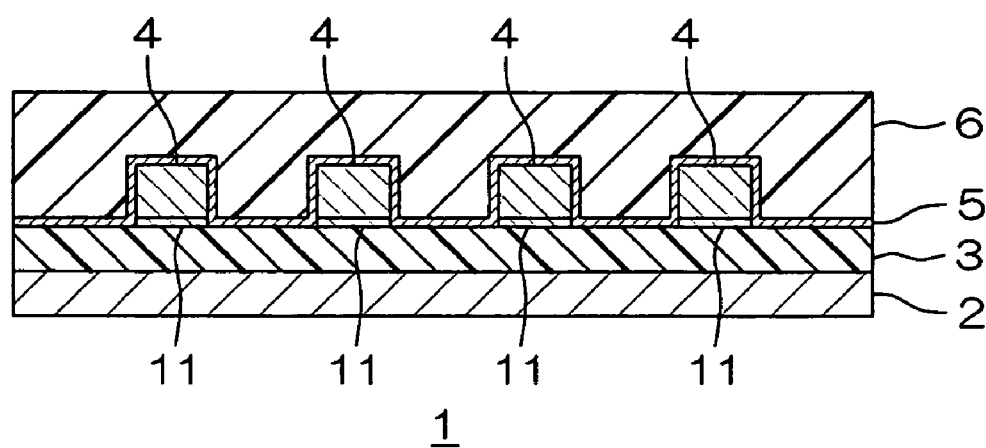
FIG. 1 is a sectional view of a suspension board with circuit taken as an embodiment of a wired circuit board of the present invention.

FIG. 1 is a sectional view of a suspension board with circuit taken as an embodiment of a wired circuit board of the present invention.

The suspension board with circuit 1 shown in FIG. 1 is a suspension board with circuit to be mounted on a hard disc drive. The suspension board with circuit 1 comprises a metal supporting board 2, an insulating base layer 3 formed on the metal supporting board 2, a conductive pattern 4 formed on the insulating base layer 3, a metal oxide layer 5 covering the conductive pattern 4, and an insulating cover layer 6 formed over the insulating base layer 3 to cover the conductive pattern 4 by the metal oxide layer 5.

The metal supporting board 2 is tabular and formed of metal foil or thin planar metal sheet. The metals that may be used for forming the metal supporting board 2 include, for example, stainless steel, 42-alloy, aluminum, copper-beryllium, and phosphor bronze, etc. Preferably, stainless steel is used for the metal supporting board 2. It is preferable that the metal supporting board 2 has a thickness of 5-100 μm.

The insulating base layer 3 is formed on the metal supporting board 2. Insulating materials that may be used for forming the insulating base layer 3 include, for example, synthetic resins commonly used for the insulating material of the wired circuit board, such as, polyimide resin, polyamide imide resin, acrylic resin, polyether nitrile resin, polyether sulfone resin, polyethylene terephthalate resin, polyethylene naphthalate resin and polyvinyl chloride resin, etc. Of these synthetic resins, a polyimide resin is preferably used for the insulating base layer 3. The insulating base layer 3 has a thickness of e.g. 5-50 µm, or preferably 10-30 µm.

The conductive pattern 4 formed on the insulating base layer 3 is configured by a plurality of lines of wire spaced apart from each other. Conductors that may be used for forming the conductive pattern 4 include, for example, metals commonly used for the conductor of the wired circuit board, such as, copper, nickel, gold, solder, or alloys thereof, etc. Of these metals, copper is preferably used for the conductive pattern 4. The conductive pattern 4 has a thickness of e.g. 3-50 µm, or preferably 5-20 µm.

When the conductive pattern 4 is formed by an additive process, a thin metal film 11 is interposed between the insulating base layer 3 and the conductive pattern 4. Chromium, copper, etc. are preferably used for the thin metal film 11.

The metal oxide layer 5 is formed to cover a surface (an upper surface and both side surfaces) of the conductive pattern 4. The metal oxide layer 5 is formed to extend continuously from the conductive pattern 4 so as to cover the surface of the insulating base layer 3 exposed from the conductive pattern 4 as well. In other words, the metal oxide layer 5 is formed to be interposed between the conductive pattern 4 and the insulating cover layer 6, as well as between the insulating base layer 3 and the insulating cover layer 6.

The metal oxide layer 5 is formed from a metal oxide such as, for example, chromium oxide, nickel oxide, copper oxide, titanium oxide, zirconium oxide, indium oxide, aluminum oxide, and zinc oxide, etc. Preferably chromium oxide is used for the metal oxide layer 5. The use of the chromium oxide can form the metal oxide layer 5 to have a steady surface-resistance value with little variation even under a high-temperature and high-humidity environment.

A degree of oxidation of the metal of the metal oxide layer 5 depends on a formation of the metal oxide layer mentioned later. The metal oxide layer 5 may be uniformly oxidized in the thickness direction or may be nonuniformly oxidized so that the degree of oxidation of its uppermost surface may be the highest and may gradually reduce therefrom inwardly in the thickness direction of the metal oxide layer 5.

The insulating cover layer 6 is formed over the insulating base layer 3 to cover the conductive pattern 4 covered by the metal oxide layer 5. The same insulating materials as those for forming the insulating base layer 3 may be used for forming the insulating cover layer 6. Preferably, polyimide resin is used for the insulating cover layer 6. The insulating cover layer 6 has a thickness of e.g. 5-50 µm, or preferably 10-30 µm.

Figure 2:
FIG. 2 is a process drawing of the suspension board with circuit shown in FIG. 1, (a) showing the step of preparing a metal supporting board, (b) showing the step of forming an insulating base layer on the metal supporting board, (c) showing the step of forming a thin metal film on the entire area of a surface of the insulating base layer, (d) showing the step of forming a plating resist on the thin meal film, and (e) showing the step of forming a conductive pattern on the thin metal film exposed from the plating resist.
Figure 2:
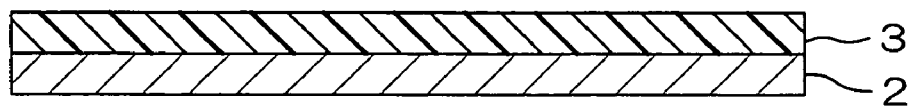
Figure 2:
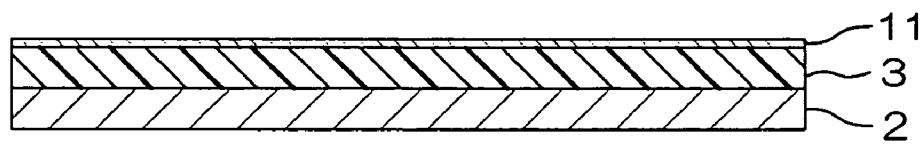
Figure 2:
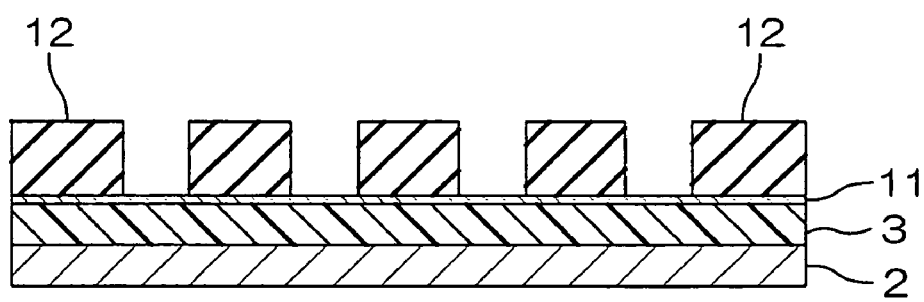
Figure 2:
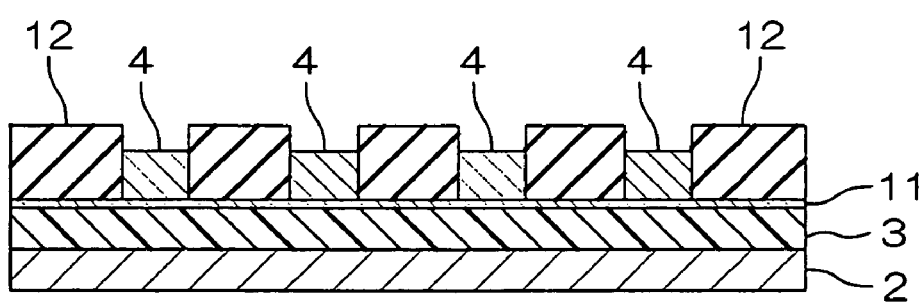
Figure 3:
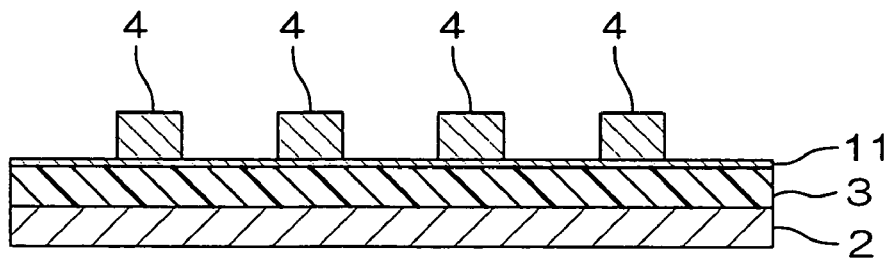
FIG. 3 is the process drawing of the suspension board with circuit which is subsequent to FIG. 2, (f) showing the step of removing the plating resist, (g) showing the step of removing the thin metal film exposed from the conductive pattern, (h) showing the step of forming a metal oxide layer by sputtering, and (i) showing the step of forming an insulating cover layer on a surface of the conductive pattern and on the metal oxide layer formed on the surface of the insulating base layer.
Figure 3:
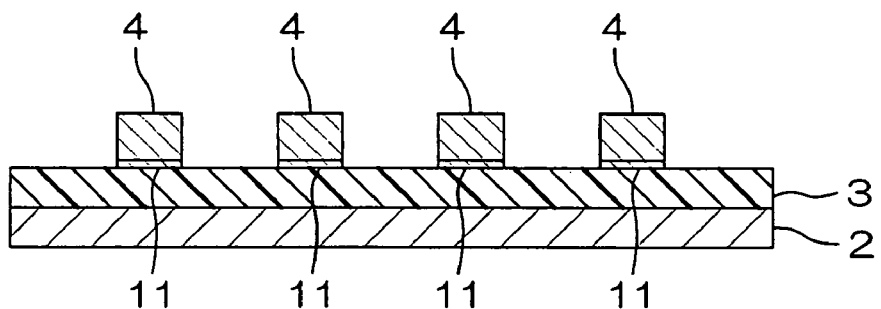
Figure 3:
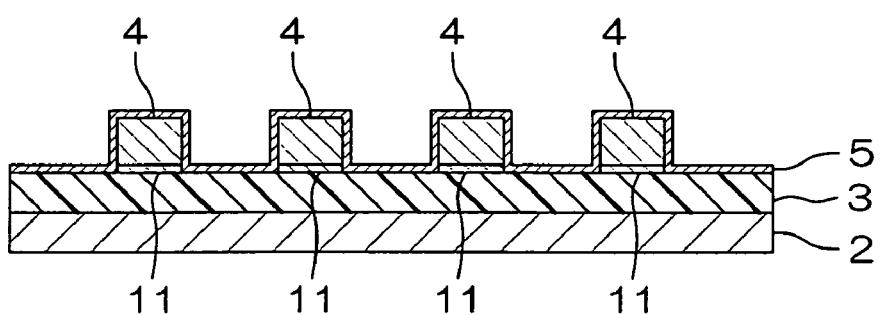
Figure 3:
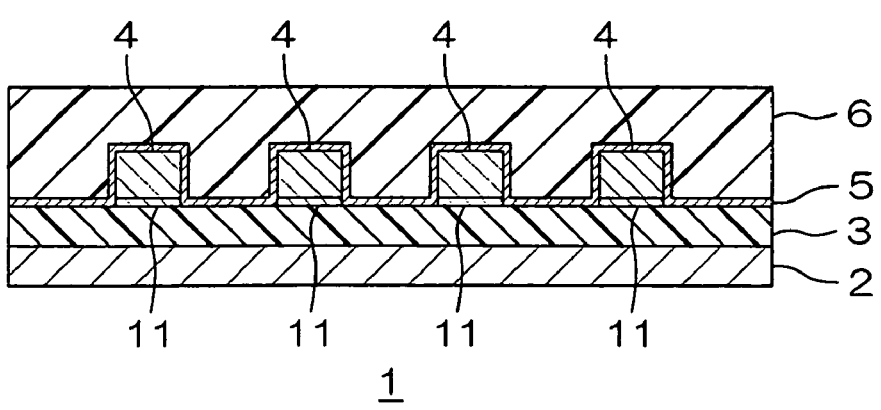

This suspension board with circuit 1 can be produced by the method shown in FIGS. 2 and 3, for example.

First, the metal supporting board 2 is prepared, as shown in FIG. 2(*a*).

Then, the insulating base layer 3 is formed on the metal supporting board 2, as shown in FIG. 2(*b*).

For example, the insulating base layer 3 is formed in the manner mentioned below. A resin solution containing the synthetic resin cited above is coated on the surface of the metal supporting board 2 and then dried, then cured by heating.

The resin solution is coated by a known method, such as, for example, a doctor blade method and a spin coat method.

A known photosensitizing agent may be mixed in the resin solution. When using this resin solution, the insulating base layer 3 can be in the form of a pattern by coating the resin solution is coated on the metal supporting board 2, and by exposing to light and developing thereafter.

Alternatively, the insulating base layer 3 may be formed by a method that after a previously processed dry film of synthetic resin is adhesively bonded to the metal supporting board 2 via an adhesive layer as needed.

Then, the conductive pattern 4 is formed on the insulating base layer 3.

The conductive pattern 4 is formed on the surface of the insulating base layer 3 by a known patterning process such as a subtractive process or an additive process, without any particular limitation on the process.

When the conductive pattern 4 is formed by the subtractive process, a conductor layer is first laminated on the entire surface of the insulating base layer 3 via an adhesive layer as needed. Then, an etching resist corresponding to the conductive pattern 4 is formed on the conductor layer. Then, with this etching resist as the resist, the conductor layer is etched and, thereafter, the etching resist is removed.

When the conductive pattern 4 is formed by the additive process, a thin metal film serving as a seed film (a ground layer) is formed on the surface of the insulating base layer 3, first. Then, a plating resist is formed on the surface of the thin metal film to have a pattern reverse to the conductive pattern 4. Then, the conductive pattern 4 is formed on a surface of the thin metal film exposed from the plating resist by plating. Thereafter, the plating resist is removed and all areas of the thin metal film except its parts corresponding to the conductive pattern 4 are removed.

Of these patterning processes, in order to realize high-density wiring, the additive process is preferably used to form a finer pattern for the conductive pattern 4.

In the additive process, the thin metal film 11 serving as the seed film (ground layer) is formed on the entire surface of insulating base layer 3, first, as shown in FIG. 2(*c*). The thin metal film 11 is formed by a vacuum vapour-deposition process, particularly a sputtering vapour-deposition process.

To be more specific, for example a thin chrome film and a thin copper film are preferably formed in sequence on the entire surface of the insulating base layer 3 by the sputtering vapour-deposition process. In the formation of the thin metal film 11, the thin chrome film is set to have a thickness of 100-600 Å and the thin copper film has a thickness of 500-2,000 Å.

Subsequently, a plating resist 12 is formed on the thin metal film 11, as shown in FIG. 2(*d*). The plating resist 12 is formed in the form of the resist pattern reverse to the conductive pattern 4 by a known process for exposing to light and developing using a dry film photoresist, for example.

Then, the conductor layer 4 is formed on the thin metal film 11 exposed from the plating resist 12, as shown in FIG. 2(*e*). Electrolytic plating may be used to form the conductor layer 4, preferably electrolytic copper plating is used therefor.

Then, the plating resist 12 is removed by a known etching process, such as a chemical etching (wet etching), or by stripping, as shown in FIG. 3(*f*).

Then, a portion of the thin metal film 11 exposed from the conductive pattern 4 (or an area of the thin metal film 11 where the plating resist 12 is formed) is removed by the known etching process, such as the chemical etching (wet etching), as shown in FIG. 3(*g*).

Then, the metal oxide layer 5 is formed on the surface of the conductive pattern 4 and on the surface of the insulating base layer 3 by the sputtering process, as shown in FIG. 3(*h*).

No particular limitation is imposed on the process of forming the metal oxide layer 5 by the sputtering. The metal oxide layer 5 can be formed, for example, by a process of sputtering using a metal as a target, and oxidizing by heating as needed, by a process of reactive sputtering, or a process of sputtering using a metal oxide as the target.

In the process whereof the sputtering using the metal as the target to form a thin metal layer and, then, oxidizing by heating, as needed, the surface of the conductive pattern 4 and the surface of the insulating base layer 3 exposed from the conductive pattern 4 are first subjected to the sputtering using the metal as the target.

Figure 4:
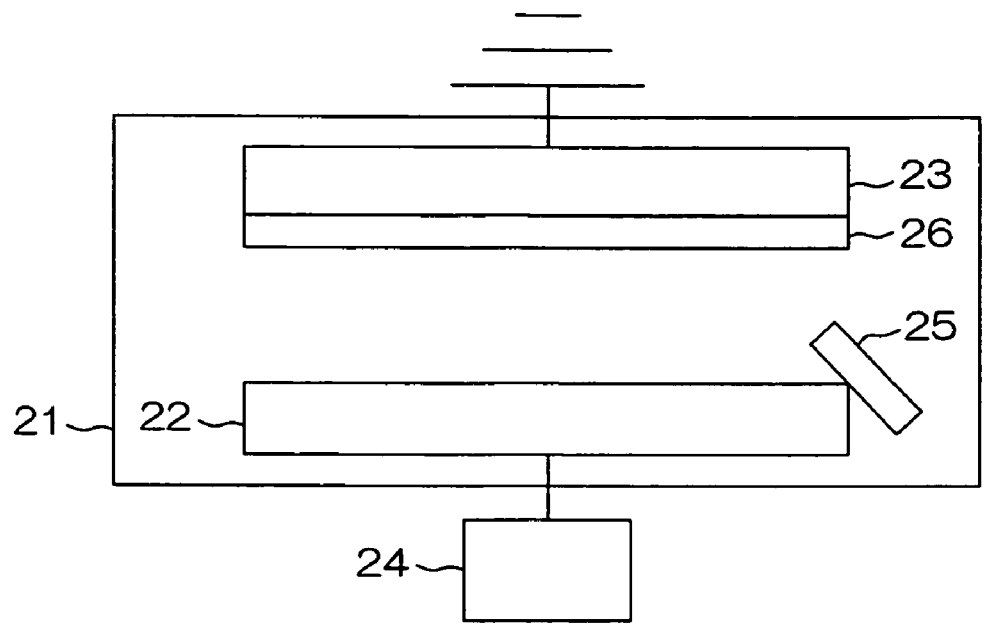
FIG. 4 is a schematic view showing the structure of a sputtering apparatus in an embodiment.

For example, a sputtering apparatus shown in FIG. 4 is used for the sputtering. Specifically, in the sputtering apparatus, a target 22 and an earth electrode 23 are arranged opposite to each other at a predetermined space in a vacuum chamber 21, as shown in FIG. 4. A power source 24 is connected to the target 22, and a plasma emission monitor 25 is arranged to emit plasma to the target 22. A pulsed power source, a direct current (DC) power source, an alternate current (RF) power source, etc. may be used as the power source 24, The earth electrode 23 is electrically grounded, and a board 26 is placed on a surface of the earth electrode 23. (The board 26 is the suspension board with circuit 1 prepared in the process shown in FIG. 3(g) and the board 26 on the side thereof on which the conductive pattern 4 is provided is arranged opposite to the target 22.)

The metals that may be used for the target 22 include, for example, chromium, nickel, copper, titanium, aluminum, tantalum, lead, zinc, zirconium, gallium, indium, and alloys thereof, etc. Preferably, chromium is used for the target 22.

Then, after an inert gas, such as argon gas, is introduced into the vacuum chamber 21, an electric power is applied from the power source 24, so that the target 22 is sputtered for a predetermined time while plasma emission intensity is maintained at a constant value by the plasma emission monitor 25. As a result of this, a sputtering coating is formed on the surface of the conductive pattern 4 and on the surface of the insulating base layer 3 to continuously extend thereon.

An example of the sputtering conditions for the sputtering using this metal as the target is given below:

(Sputtering Condition 1)
Ultimate vacuum: $1.33 \times 10^{-5}$ Pa to $1.33 \times 10^{-2}$ Pa
Flow rate of introduced gas (Argon): $1.2 \times 10^{-3}$ m$^3$/h to $4 \times 10^{-3}$ m$^3$/h
Operating pressure (Degree of vacuum after introduction of introduced gas): $1.33 \times 10^{-2}$ Pa to 1.33 Pa
Temperature of earth electrode: 10° C.-100° C.
Electric power: 100 W-2,000 W
Sputtering time: 1 second to 15 minutes (Sputtering Condition 2)
Ultimate vacuum: $1.33 \times 10^{-5}$ Pa to $1.33 \times 10^{-2}$ Pa
Flow rate of introduced gas (Argon): $1.2 \times 10^{-3}$ m$^3$/h to $4 \times 10^{-3}$ m$^3$/h
Operating pressure (Degree of vacuum after introduction of introduced gas): $1.33 \times 10^{-2}$ Pa to 1.33 Pa
Temperature of earth electrode: 10° C.-100° C.
Electric power: 10 W-130 W
Sputtering time: 1 second to 15 minutes.

In this sputtering, an adequate sputtering is selected from known sputtering methods, such as direct current sputtering, ration frequency sputtering, magnetron sputtering, or combination thereof.

Then, the sputtering coating is oxidized by heating as needed. No particular limitation is imposed on the way of heating. For example, the sputtering coating is heated in a heating furnace in the atmosphere. In the sputtering condition 1, the heating temperature is in a range of e.g. 280° C.-310° C., or preferably about 300° C. In the sputtering condition 2, the heating temperature is in a range of e.g. 110° C.-140° C., or preferably about 125° C. The heating time in both conditions 1 and 2 is preferably in a range of e.g. one minute to twelve hours. As a result of this, the metal oxide layer 5 is formed to continuously extend along the surface of the conductive pattern 4 and the surface of the insulating base layer 3, as shown in FIG. 3(h).

If the sputtering coating is naturally oxidized under air exposure, then the sputtering coating need not particularly be heated or may be heated to form a steady metal oxide layer.

This metal oxide layer 5 is nonuniformly oxidized so that the degree of oxidation of its uppermost surface is the highest and gradually reduces therefrom inwardly in the thickness direction of metal oxide layer 5.

The metal oxide layer 5 thus formed has a thickness of e.g. 5-100 nm under the sputtering condition 1 as well as under the sputtering condition 2.

In the reactive sputtering, the same processes as those described above are taken, except the process of introducing the introduced gas comprising oxygen in the vacuum chamber 21, using the sputtering apparatus shown in FIG. 4.

To be more specific, the same metal as the metal used for forming the sputtering coating mentioned above is used as the target 22 and set in place. Also, the thin metal film 11 of the suspension board with circuit 1 which is in the process of production as shown in FIG. 3(g) is placed so that the board 26 on the side thereof on which the conductive pattern 4 is arranged opposite to the target 22.

Then, after a reactive gas including argon or nitrogen, and oxygen of an essential gas are mixed in a given proportion (e.g. Ar/O$_2$ mixed gas) is introduced in the vacuum chamber 21, an electric power is applied to the target 22 from the power source 24, so that the target 22 is sputtered for a predetermined time while the plasma emission intensity is maintained at a constant value by the plasma emission monitor 25.

As a result of this, the metal oxide layer 5 is formed on the surface of the conductive pattern 4 and on the surface of the insulating base layer 3 to continuously extend thereon, as shown in FIG. 3(h). The metal oxide layer 5 thus formed is uniformly oxidized in the thickness direction.

An example of the sputtering conditions for this reactive sputtering is given below:
Ultimate vacuum: $1.33 \times 10^{-5}$ Pa to $1.33 \times 10^{-2}$ Pa
Flow rate of introduced gas (Argon): Ar: $1.2 \times 10^{-3}$ m$^3$/h to $4 \times 10^{-3}$ m$^3$/h
Flow rate of introduced gas (Oxygen): O$_2$: $6 \times 10^{-5}$ m$^3$/h to $30 \times 10^{-5}$ m$^3$/h
Operating pressure (Degree of vacuum after introduction of introduced gas): $1.33 \times 10^{-2}$ Pa to 1.33 Pa
Temperature of earth electrode: 10° C.-100° C.
Electric power: 10 W-2,000 W
Sputtering time: 1 second to 15 minutes
The metal oxide layer 5 thus formed has a thickness of e.g. 5-200 nm.

In the sputtering using a metal oxide as the target, the same processes as those described above can be taken, except that the metal oxide is used as the target 22 and also the alternate current power source is used as the power source 24 in the sputtering apparatus shown in FIG. 4. The metal oxides that may be used as the target 22 include, for example, chromium oxide, zirconium oxide, silicon oxide, tin oxide, titanium oxide, magnesium oxide, and aluminum oxide. Preferably, chromium oxide is used as the target.

To be more specific, the metal oxide cited above is used as the target 22, and the suspension board with circuit 1 which is in the process of production as shown in FIG. 3(g) is placed so that the board 26 on the side thereof on which the conductive pattern 4 is arranged opposite to the target 22.

Then, after an inert gas of argon is introduced as the introduced gas in the vacuum chamber 21, an electric power is applied from the power source 24, so that the target 22 is sputtered for a predetermined time while plasma emission intensity is maintained at a constant value by the plasma emission monitor 25. As a result of this, the metal oxide layer 5 is formed on the surface of the conductive pattern 4 and on the surface of the insulating base layer 3 to continuously extend thereon, as shown in FIG. 3(h). The metal oxide layer 5 thus formed is uniformly oxidized in the thickness direction.

An example of the sputtering conditions for this sputtering using this metal oxide as the target is given below.

Ultimate vacuum: $1.33\times10^{-5}$ Pa to $1.33\times10^{-2}$ Pa

Flow rate of introduced gas (Argon): $1.2\times10^{-3}$ m$^3$/h to $4\times10^{-3}$ m$^3$/h Operating pressure (Degree of vacuum after introduction of introduced gas): $1.33\times10^{-2}$ Pa to 1.33 Pa Temperature of earth electrode: 10° C.-100° C.

Electric power: 10 W-2,000 W

Sputtering time: 1 second to 15 minutes

The metal oxide layer 5 thus formed has a thickness of e.g. 5-300 nm.

Also, the metal oxide layer 5 has a surface resistance preferably in a range of not less than $10^{12}$ $\Omega/\square$, or further preferably in a range of between $1\times10^{13}$ $\Omega/\square$ and usually not more than $1\times10^{15}$ $\Omega/\square$.

Then, the insulating cover layer 6 is formed over the insulating base layer 3 to cover the conductive pattern 4 covered by the metal oxide layer 5, as shown in FIG. 3(i). The suspension board with circuit 1 is obtained in the manner described above.

A resin solution containing the synthetic resin cited above is coated over the insulating base layer 3 (specifically on the metal oxide layer 5 formed on the surface of the insulting base layer 3) to cover the conductive pattern 4 covered by the metal oxide layer 5 in the same manner as in the above and then is cured by heating, thereby to produce the insulating cover layer 6. A known photosensitizing agent may be mixed in the resin solution. When using this resin solution, the insulating cover layer 6 can be in the form of a pattern by a method that the resin solution is coated over the insulating base layer 3 to cover the conductive pattern 4 covered by the metal oxide layer 5, and exposed to light and then developed thereafter.

According to this suspension board with circuit 1, since the metal oxide layer 5 is formed by the sputtering process, the metal oxide layer 5 can be formed with a uniform thickness. Hence, the metal oxide layer 5 can fully function as a barrier layer to the conductive pattern 4 to prevent the metal for forming the conductive pattern 4 from diffusing in the insulating cover layer 6. As a result of this, deterioration of the conductive pattern 4 and short-circuiting of the conductive copper layer 4 can be prevented effectively.

Although the suspension board with circuit 1 has been illustrated above as an example of the wired circuit board of the present invention, the wired circuit board of the present invention includes a single-sided flexible wired circuit board, a double-sided flexible wired circuit board, and a multilayer flexible wired circuit board.

Figure 5:
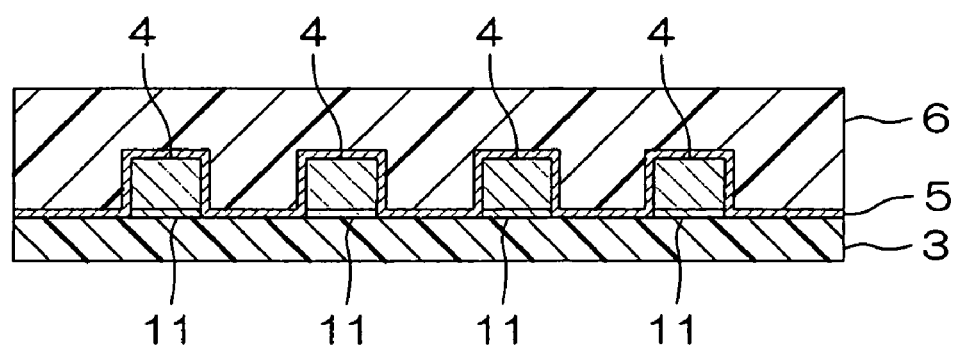
FIG. 5 is a sectional view of a single-sided flexible wired circuit board taken as another embodiment of the wired circuit board of the present invention.

For example, a single-sided flexible wired circuit board 31 comprises the insulating base layer 3, the conductive pattern 4 formed on the insulating base layer 3, the metal oxide layer 5 formed on the surface of the conductive pattern 4 and on the surface of the insulating base layer 3 by sputtering, and insulating cover layer 6 formed over the insulating base layer 3 to cover the conductive pattern 4 covered by the metal oxide layer 5, as shown in FIG. 5.

Although the embodiment in which the metal oxide layer 5 is formed on the surface of the conductive pattern 4 and on the surface of the insulating base layer 3 has been described above, the metal oxide layer 5 may be formed on the surface of the conductive pattern 4 only.

EXAMPLES

While in the following, the present invention will be described in further detail with reference to Examples, the present invention is not limited to any of the examples.

Example 1

A metal supporting board of a stainless foil of 25 µm thick was prepared (cf. FIG. 2(a)). Then, a resin solution of a precursor of a photosensitive polyimide resin was coated over the metal supporting board. After dried, the coated resin solution was cured by heating. Thereafter, it was exposed to light and then developed. The insulating base layer of a polyimide resin of 10 µm thick was formed on the metal supporting board in the manner mentioned above (cf. FIG. 2(b)).

Then, a thin chromium film and a thin copper film were formed in sequence on the entire surface of the insulating base layer to form a thin metal film of 2,000 Å thick by a sputtering vapour-deposition method (cf. FIG. 2(c)).

Then, a resist pattern reverse to the conductive pattern was formed on the thin metal film by exposing to light and developing using a dry film resist (cf. FIG. 2(d)).

Then, a conductive pattern of 10 µm thick was formed on the thin metal film 11 exposed from the plating resist by electrolytic copper plating (cf. FIG. 2(e)).

Then, the plating resist was removed by chemical etching (cf. FIG. 3(f)) and, then, the thin metal film exposed from the conductive pattern was also removed by the chemical etching (cf. FIG. 3(g)).

Then, after the sputtering was carried out using a metal as a target, the thin metal film formed by the sputtering was oxidized by a heating to thereby to form a metal oxide layer on the surface of the conductive pattern and on the surface of the insulating cover layer.

The sputtering was carried out in the same manner as in the sputtering mentioned above and under the conditions mentioned below:

Target: Chromium

Ultimate vacuum: $1.33\times10^{-4}$ Pa

Flow rate of introduced gas (Argon): $2\times10^{-3}$ m$^3$/h

Operating pressure: 0.13 Pa

Temperature of earth electrode: 60° C.

Electric power: DC150 W

Sputtering time: 5 seconds

Subsequently, the surface of the thin metal film formed by a thin chromium film was oxidized by heating at 300° C. for 12 hours in the atmosphere, whereby the metal oxide layer was formed on the thin metal film (cf. FIG. 3(h)). The thickness of the metal oxide layer was 8 nm.

The presence of the metal oxide layer was confirmed by ESCA. Also, when a surface resistance of the metal oxide layer was measured at a temperature of 25° C. and a humidity of 15%, using a surface resistance measuring device (Hiresta-up MCP-HT450 available from Mitsubishi Chemical Corporation, it was $2.1\times10^{12}$ $\Omega/\square$.

Then, a resin solution of a precursor of a photosensitive polyimide resin was coated over the surface of the insulating base layer and the surface of the conductive pattern. After dried, it was cured by heating. Thereafter, it was exposed to light and then developed, to form the insulating base layer of a polyimide resin of 5 μm thick. The suspension board with circuit was produced by the method described above (cf. FIG. 3(*i*)).

Example 2

The same operations as in Example 1 were conducted to produce the suspension board with circuit except that the conditions in the formation of the metal oxide layer of Example 1, for the sputtering and the oxidization-by-heating after sputtering were modified as follows:
Target: Chromium
Ultimate vacuum: $1.33 \times 10^{-4}$ Pa
Flow rate of introduced gas (Argon): $2 \times 10^{-3}$ m$^3$/h
Operating pressure: 0.13 Pa
Temperature of earth electrode: 60° C.
Electric power: DC120 W
Sputtering time: 5 seconds
Heating temperature after sputtering: 125° C.
Heating time after sputtering: 12 hours
The thickness of the metal oxide layer obtained was 6 nm.
When a surface resistance of the metal oxide layer formed was measured at a temperature of 25° C. and a humidity of 15%, using the surface resistance measuring device (Hiresta-up MCP-HT450 available from Mitsubishi Chemical Corporation, it was $8.8 \times 10^{12}$ Ω/□.

Example 3

The same operations as in Example 1 were conducted to produce the suspension board with circuit except that in the formation of the metal oxide layer of Example 1, the sputtering was carried out under the following conditions and the sputtering coating formed was not oxidized after heating.
Target: Chromium
Ultimate vacuum: $1.33 \times 10^{-4}$ Pa
Flow rate of introduced gas (Argon): $2 \times 10^{-3}$ m$^3$/h
Flow rate of introduced gas (Oxygen): $1 \times 10^{-4}$ m$^3$/h
Operating pressure: 0.13 Pa
Temperature of earth electrode: 60° C.
Electric power: DC300 W
Sputtering time: 15 seconds
The thickness of the metal oxide layer obtained was 20 nm.
When a surface resistance of the metal oxide layer formed was measured at a temperature of 25° C. and a humidity of 15%, using the surface resistance measuring device (Hiresta-up MCP-HT450 available from Mitsubishi Chemical Corporation, it was $1.0 \times 10^{13}$ Ω/□.

Example 4

The same operations as in Example 1 were conducted to produce the suspension board with circuit except that in the formation of the metal oxide layer of Example 1, the sputtering was carried out under the following conditions and the sputtering coating formed was not oxidized after heating.
Target: Chromium oxide
Ultimate vacuum: $1.33 \times 10^{-4}$ Pa
Flow rate of introduced gas (Argon): $2 \times 10^{-3}$ m$^3$/h
Operating pressure: 0.13 Pa
Temperature of earth electrode: 60° C.
Electric power: RF400 W
Sputtering time: 40 seconds
The thickness of the metal oxide layer obtained was 300 nm.
When a surface resistance of the metal oxide layer formed was measured at a temperature of 25° C. and a humidity of 15%, using the surface resistance measuring device (Hiresta-up MCP-HT450 available from Mitsubishi Chemical Corporation, it was $1.1 \times 10^{13}$ Ω/□.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:
1. A wired circuit board comprising:
an insulating base layer,
a seed film formed on the insulating base layer, the seed film comprising a relatively thin chromium film,
a conductive pattern formed on the seed film,
a metal oxide layer formed to cover the conductive pattern by sputtering, the metal oxide layer comprising a chromium oxide layer, and
an insulating cover layer formed over the insulating base layer to cover the conductive pattern covered by the metal oxide layer,
wherein the metal oxide layer has a thickness of 5-300 nm and a surface resistance of the metal oxide layer is not less than $10^{12}$ Ω/□.
2. The wired circuit board according to claim 1, wherein the seed film further comprises a thin copper film, and
the thin chromium film has a thickness of 100-600 Å, and the thin copper film has a thickness of 500-2000 Å.

* * * * *